US007794120B2

(12) United States Patent
Wong et al.

(10) Patent No.: US 7,794,120 B2
(45) Date of Patent: Sep. 14, 2010

(54) ILLUMINATION ASSEMBLY WITH DIFFUSIVE REFLECTOR CUP

(75) Inventors: Kum Soon Wong, Kuala Lumpur (MY); Yean Chon Yaw, Penang (MY)

(73) Assignee: Avago Technologies ECBU IP (Singapore) Pte. Ltd., Singapore (SG)

(*) Notice: Subject to any disclaimer, the term of this patent is extended or adjusted under 35 U.S.C. 154(b) by 2 days.

(21) Appl. No.: 12/057,218

(22) Filed: Mar. 27, 2008

(65) Prior Publication Data

US 2009/0244903 A1 Oct. 1, 2009

(51) Int. Cl.
*F21V 7/00* (2006.01)
(52) U.S. Cl. ............... 362/348; 362/297; 362/311.1
(58) Field of Classification Search .......... 362/246, 362/247, 310, 311, 348, 297, 311.09, 311.1, 362/311.11; 257/98, 99, 100
See application file for complete search history.

(56) References Cited

U.S. PATENT DOCUMENTS

| | | | | |
|---|---|---|---|---|
| 1,258,007 A | * | 3/1918 | Hess | 362/348 |
| 1,915,842 A | * | 6/1933 | Winkler | 362/348 |
| 4,864,476 A | * | 9/1989 | Lemons et al. | 362/297 |
| 5,144,190 A | * | 9/1992 | Thomas et al. | 362/348 |
| 5,483,424 A | * | 1/1996 | Lightbody | 362/348 |
| 6,254,256 B1 | * | 7/2001 | Wolfe | 362/348 |
| 6,670,648 B2 | * | 12/2003 | Isokawa et al. | 257/99 |
| 7,021,813 B2 | * | 4/2006 | Lee et al. | 362/348 |
| 2007/0034886 A1 | * | 2/2007 | Wong et al. | 257/98 |
| 2007/0262336 A1 | * | 11/2007 | Tamaki et al. | 257/98 |

FOREIGN PATENT DOCUMENTS

JP          05021043 A   *   1/1993

* cited by examiner

*Primary Examiner*—Y My Quach Lee

(57) ABSTRACT

One embodiment of a method for configuring consumption of service includes identifying a service to be consumed by a user, identifying a plurality of bearer technologies across which at least one electronic device can access the service, selecting one of the plurality of bearer technologies for use in configuring the at least one electronic device, and configuring the at least one electronic device for the service using one of a plurality of management frameworks according to the selected bearer technology.

18 Claims, 2 Drawing Sheets

ILLUMINATION ASSEMBLY WITH DIFFUSIVE REFLECTOR CUP

BACKGROUND

Illumination assemblies are used in an enormous number of different products, such as in displays for video and computer equipment, lighting equipment, etc. A typical light source in an illumination assembly, such as a light emitting diode (LED), often does not have an optimal radiation pattern for the application. For example, most of the illumination from an LED die may be directed primarily from the top and sides of the die, resulting in wasted light from the sides and a spotlight effect from the top of the die. A display using LED dies without other features to condition the radiation pattern from the LED dies might appear both dim and uneven or spotty.

Conventional illumination assemblies may include an encapsulant over the LED die that has a highly diffusive material dispersed throughout the encapsulant. One example of an encapsulant with a highly diffusive material is an epoxy with many fine borosilicate particles spread throughout the epoxy. The diffusive encapsulant does provide several benefits, such as physical protection of the LED die and random scattering of the light rays from the LED die as they pass through the encapsulant and hit the particles. The resulting light from the illumination assembly thus has a more diffuse than specular character. Unfortunately, diffusive encapsulants also have several disadvantages. As the light passes through the diffusive encapsulant and is scattered, flux losses in the light may be high due to the three dimensional, volumetric scattering of light bouncing back and forth within the encapsulant. The use of a diffusive encapsulant over the light source may also lead to physical weakness or failure if another encapsulant is used over the top of the diffusive encapsulant. For example, if the diffusive encapsulant is placed over an LED die and another structural non-diffusive encapsulant is placed over that in the illumination assembly, the two encapsulants may have coefficients of thermal expansion. As the illumination heats up under use, the different encapsulants expand at different rates, causing failure of components at boundaries between the encapsulants. If a wire bond for the LED die passes through the boundary between the two encapsulants, it is susceptible to breakage due to the different coefficients of thermal expansion. Finally, the radiation pattern generated as light passes through a diffusive encapsulant is very difficult to sculpt or direct.

DESCRIPTION

The drawings and description, in general, disclose an illumination assembly having a diffusive reflector cup. The reflector cup is rendered diffusive by the presence of distensions or coatings that alter the angle of reflection of incident light upon the reflector cup wall. This avoids the need for diffusive encapsulants over light sources within the reflector cup.

The term "distension" is used herein to refer to any shape or form on the reflector cup wall that changes the slope of the wall. Distensions may project from the reflector cup wall into the interior cavity of the reflector cup, or may recede from the reflector cup wall away from the interior cavity of the reflector cup. Examples of distensions include domes (convex bumps or protrusions of any shape into the interior cavity of the reflector cup), dimples (concave voids or indentations that recede away from the interior cavity of the reflector cup), etc. Distensions, rather than merely having discrete forms such as domes or dimples on an otherwise regular and smooth reflector cup wall, may also have a continuously varying profile, such as a repetitively rolling contour combining both protrusions and indentations similar to an acoustic foam or egg carton geometry. (Note that a smooth, constant slope is not a continuously varying profile.)

Creating a varied topography on a reflector surface such as an array of domes effectively results in a rough surface that diffusively reflects light from a light source near the reflector surface. Rather than having a reflector cup wall with a uniform slope, the topography or profile of the reflector surface is varied to provide the desired reflection pattern in the reflected light. Any desired reflectance patterns may be generated, from diffuse but shaped patterns to near or complete Lambertian reflectance wherein light is scattered substantially uniformly in all directions from the surface of the reflector and the apparent brightness of the surface is the same from all view angles.

Figure 1:
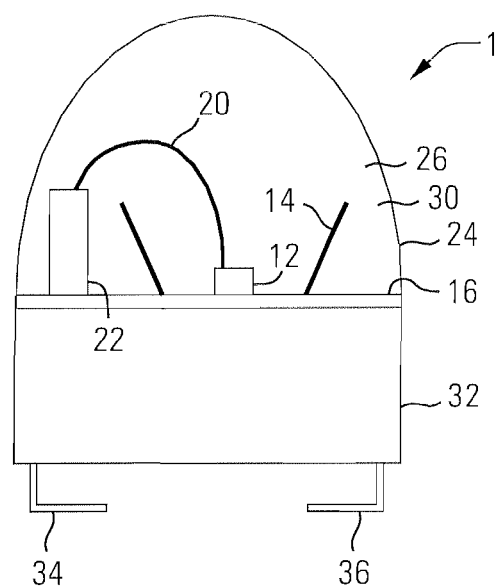
FIG. 1 is a cross-sectional side view of an exemplary illumination system with a reflector cup having a diffusive surface.

Referring now to FIG. 1, an exemplary illumination assembly 10 includes one or more light sources such as an LED die 12 mounted within a reflector cup 14. The LED die 12 may be mounted on a substrate 16 such as a printed circuit board or a conductive lead frame. One or more wire bonds 20 may be used to provide electrical connections to the LED die 12, such as connecting an anode of the LED die 12 to an anode post 22. Other electrical connections may be made on the substrate 16, such as connecting a cathode on the base of the LED die 12 to a cathode connection pad. A lens 24 may be placed over the illumination assembly 10, and an encapsulant 26 such as a clear epoxy may be used to fill a void 30 under the lens 24 and in the reflector cup 14. The encapsulant 26 provides physical protection to the LED die 12 and the wire bond 20, including preventing moisture from reaching the LED die 12, and may be used to attach the lens 24 to the illumination assembly 10. The illumination assembly 10 may also include a housing 32 made of any suitable material such as plastic or ceramic, and leads 34 and 36 to conduct electricity to the LED die 12.

It is important to note that the illumination assembly with a diffusive reflector cup is not limited to any particular configuration of structure, and that the diffusive reflector cup may be used with any variations on the illumination assembly. The diffusive reflector cup disclosed herein for use with an illumination assembly avoids the need for a highly diffusive encapsulant material over the light source in the reflector cup, whatever the particular configuration and design of the illumination assembly. A single encapsulant material can fill the entire illumination assembly under the lens (or any portion thereof), including the reflector cup, unlike traditional designs in which an encapsulant with a highly diffusive material was placed in the reflector cup and another encapsulant placed in the rest of the illumination assembly so that the wire bond passed through a boundary between the two encapsulants. In that traditional design, the encapsulants would have had different coefficients of thermal expansion, causing them to expand to different extents during use and to stress the wire bond (e.g., 20), potentially breaking it and causing the light to fail.

Figure 2:
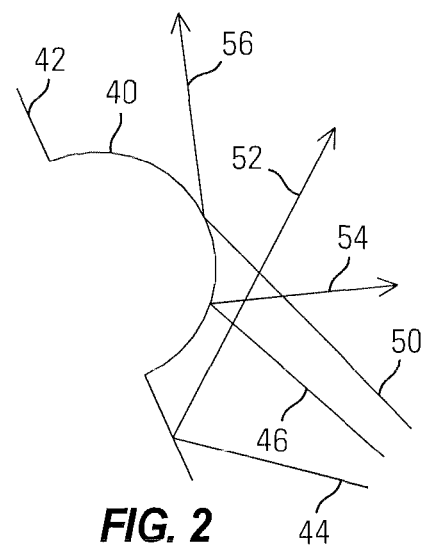
FIG. 2 is a cross-sectional profile of a dome on an exemplary reflector cup wall.

Turning now particularly to a discussion of the diffusive reflector cup, distensions on the reflective wall of the reflector cup alter the angle of reflectance of incident light on the reflector cup wall. For example, as illustrated in FIG. 2, a dome 40 may be formed on the wall 42 of the reflector cup. Incident light rays 44, 46 and 50 that emanate from roughly the same location such as the light source (not shown) will reflect in different directions 52, 54 and 56 from the wall 42 or from various points on the dome 40. Again, the distensions may have whatever shape or form desired based on the light sources, the desired light output, the overall reflector cup geometry, etc. Distensions may take whatever shape, size and scale desired.

Figure 3:
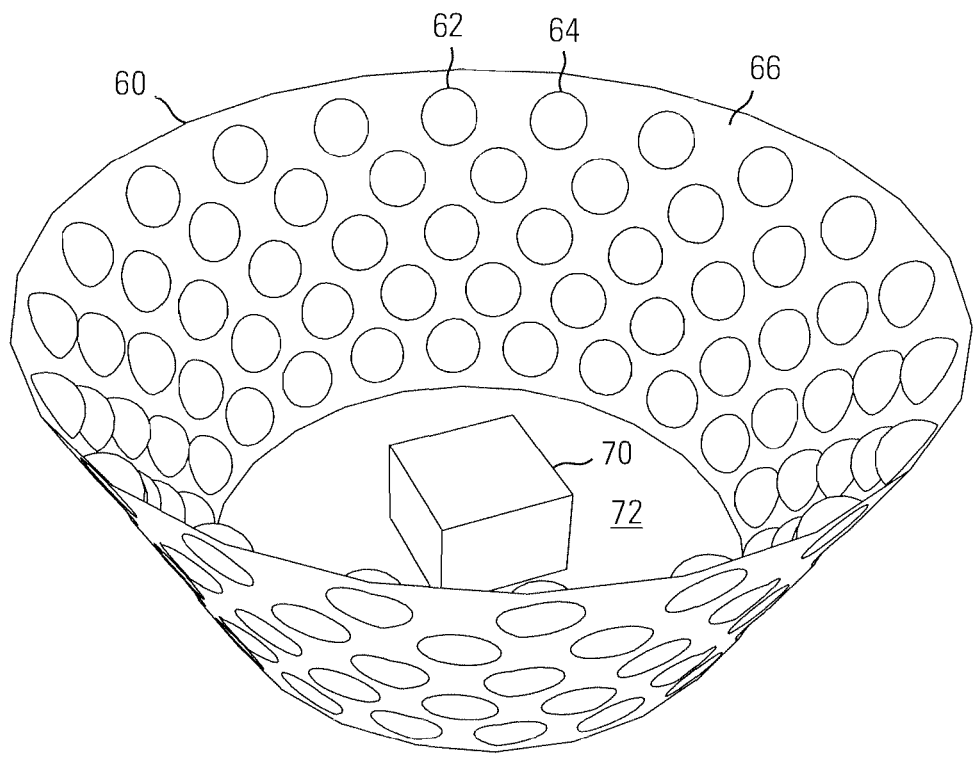
FIG. 3 is a perspective view of an exemplary dome pattern on a reflector cup wall.

Referring now to FIG. 3, an exemplary reflector cup 60 may have an array of domes (e.g., 62 and 64) on the surface of the reflector cup wall 66. Light from an LED die 70 mounted on a base 72 of the reflector cup 60 is diffusely reflected from the reflector cup wall 66 and the array of domes (e.g., 62 and 64). (The base 72 may comprise a unitary portion of the reflector cup 60 or may comprise the substrate on which the reflector cup 60 is mounted.) Note that the scale, layout and overall geometry of the topography of the reflector cup walls illustrated in the drawings is purely exemplary. The shape of the reflector cup 60 is not limited to that illustrated, for example, the size, the overall slope of the reflective walls, the height and width, etc. may be modified as desired. The reflector cup 60 may have any desired shape, such as round, elliptical, square, rectangular, etc. For example, if multiple light sources are placed in a single reflective cup, such as a red, a green and a blue light source, an elliptical or oval reflective cup may provide an optimal light output.

It is also important to note that the size and scale of the domes (e.g., 62 and 64) in FIG. 3 has been exaggerated for clarity. A more numerous array of smaller domes may provide a more diffuse output light. However, the diffusing features on the surface of the reflector cup 60 may be adapted as desired to shape or customize the output light and for other considerations such as ease of manufacturing and to improve the physical adherence of the encapsulant. For example, shallower protrusions or indentations on the reflector cup wall may sufficiently diffuse the output light while minimizing scattering losses, but more prominent protrusions or indentations may minimize the risk of encapsulant delamination by providing deeper overhangs or varied slopes for the encapsulant to grip.

Figure 4:
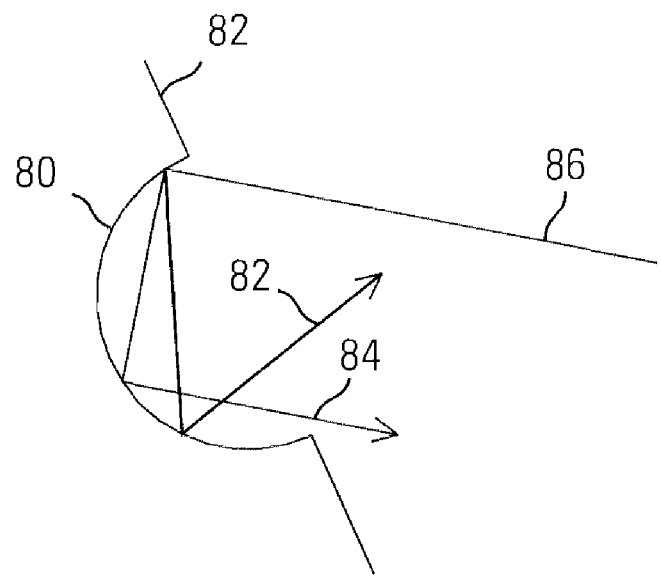
FIG. 4 is a cross-sectional profile of a dimple in an exemplary reflector cup wall.

As mentioned above, distensions may also comprise dimples 80 as illustrated in FIG. 4. Dimples 80 provide extra surfaces for light rays to reflect in multiple times. Each reflection within a dimple 80 may also create a diffuse component if an optically rough surface is provided, thus creating a chain reaction of multiple rays 82 and 84 reflecting from the dimple 80 at different angular directions from one incident light ray 86. This helps create a more diffuse overall light output from the reflector cup. The diffuse reflection may be caused by the geometry of the reflector cup wall or the rough texture of the surface of the reflector wall including the texture on dome/dimple shapes, etc or both.

The distensions on the wall of a reflector cup may consist of an array of homogeneous topological features, such as an array of domes or dimples, or may have a heterogeneous mix of different diffusing features of various shapes, sizes, scales, etc. The distribution of surface features may be uniform across the surface of the reflector cup, or may vary as a function of spatial location to create the desired diffuse reflection. For example, in one embodiment a desired diffuse reflection pattern may be obtained by placing more numerous and densely packed domes at the bottom of the reflector cup near the LED die, and placing fewer and less dramatically shaped domes at the top of the reflector cup. Diffusive features on the surface of reflector cup may also be nested if desired. For example, smaller domes or dimples may be located on the surface of a dome or dimple.

In one embodiment, a surface coating may be used in place of or in addition to distensions to cause the desired diffusion of incident light. Thus, the reflector cup may be given the desired diffusive reflective pattern by a shaped and contoured surface, or by a diffusive textured coating applied to the surface (such as an optical grade Spectralon® coating available from the Labsphere corporation of North Sutton, N.H.), or a combination of these elements.

A diffusive reflector cup may be manufactured in any suitable process for forming the desired diffusely reflective surface. The reflector cup may be formed by rolling or stamping the diffusing features into a sheet of metal, then forming reflector cups with the resulting shaped sheet. The reflector cup may also be directly stamped into a material sheet, simultaneously forming the cup and the diffusing features. The reflector cup with its diffusing features may be molded in one or more pieces using a pourable or moldable material such as plastic. The reflector cup may be formed from a single material or multiple materials. For example, the reflector cup may be stamped out of a metal having the desired surface reflectance. The reflector cup may alternatively be molded out of plastic and the surface coated in a reflective material using any suitable process such as spraying, dipping, sputtering, powder coating, electrolytic coating, etc.

Note that language herein stating that distensions such as domes or dimples are located on the surface of a reflector cup does not necessarily imply that they are purely surface features. These features may be formed on a surface layer of a reflector cup, or may be formed in the main structural material of the reflector cup, or may be formed in any manner desired so that the reflector surface has the desired diffusive characteristics.

An exemplary illumination assembly may be formed by connecting a light source such as an LED die electrically and physically to a substrate, for example, by surface mounting the cathode on the base of an LED die to a cathode connection pad on a printed circuit board using solder paste and a wave flow process. The anode on the top or side of the LED die may be wire bonded to an anode pad or post on the substrate, either outside or inside of reflector cup. A lens may be placed over the top of the assembly, filling the entire resulting void or a portion thereof with an encapsulant such as a clear epoxy. Conductive leads, either surface mount or through hole pins, may be connected to light source leads on the substrate and a housing molded around the leads. In one embodiment, the substrate may comprise an electrically conductive lead frame to which LED dies are electrically connected and mounted, with a plastic or ceramic housing then formed around the lead frame. The reflector cup, encapsulant, and lens etc. may then be added as desired, with leads then cut out of frame and bent to form a single illumination assembly.

Figure 5:
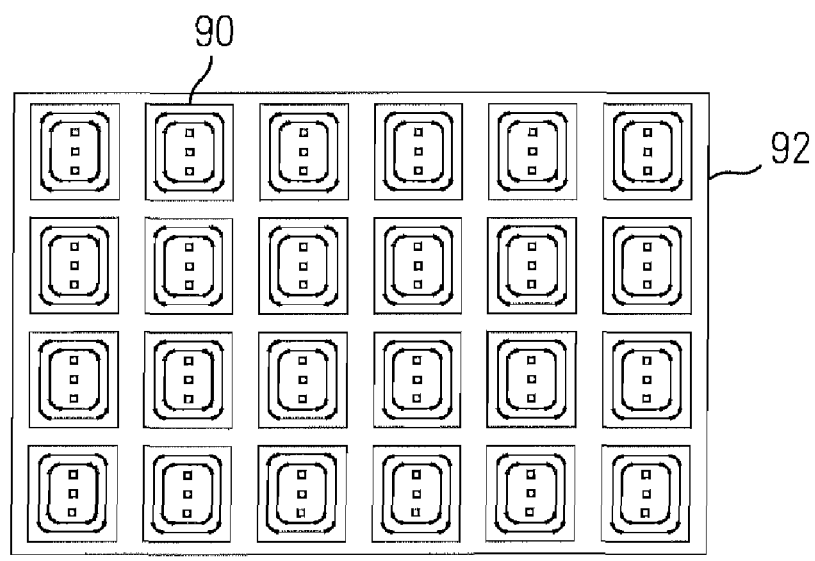
FIG. 5 is a block diagram of an exemplary display having multiple LED housings with diffusive reflector cups.

The illumination assembly with a diffusive reflector cup may be used in any suitable application, such as a display. In this use, an array of illumination assemblies may be connected along with control circuitry to form a display or monitor as illustrated in FIG. 5. For example, a color stadium display 90 may include an array of illumination assemblies 92 each having a red, a green and a blue light source mounted within a single diffusive reflector cup.

Although exemplary embodiments have been described herein, the system and method for configuring consumption of service is not limited to any particular type of device, service, service provider or bearer technology. The system and method described herein configures the consumption of service for a user, simplifying the configuration process particularly in complex environments such as multiple devices with different capabilities, multiple bearer technologies, etc.

While illustrative embodiments have been described in detail herein, it is to be understood that the concepts disclosed herein may be otherwise variously embodied and employed, and that the appended claims are intended to be construed to include such variations, except as limited by the prior art.

What is claimed is:

1. An illumination assembly comprising:
   a light source;
   a reflector cup, said light source being located within said reflector cup, said reflector cup having a wall comprising a smooth reflective surface with at least one diffuser;
   a clear encapsulant at least partially filling said reflector cup;
   said at least one diffuser comprising a plurality of discrete indentations extending from said smooth reflective surface into said wall of said reflector cup;
   wherein, said plurality of discrete indentations are spaced from one another such that a portion of said smooth reflective surface completely surrounds each of said plurality of discrete indentations; and
   a lens mounted over said reflector cup and said light source, said encapsulant at least partially filling a void under said lens.

2. The illumination assembly of claim 1, wherein said plurality of discrete indentations is arranged as a spatially uniform array.

3. The illumination assembly of claim 1, wherein said plurality of discrete indentations has an irregular spatial arrangement.

4. The illumination assembly of claim 1, further comprising a housing around said reflector cup and said light source.

5. The illumination assembly of claim 1, further comprising a plurality of electrically conductive leads.

6. The illumination assembly of claim 1, said light source comprising at least one light emitting diode die.

7. The illumination assembly of claim 1, said light source comprising a plurality of light emitting diode dice.

8. The illumination assembly of claim 1 and further wherein said plurality of discrete indentations comprises a plurality of dimples.

9. The illumination assembly of claim 8 and further wherein each of said plurality of dimples comprises an arcuate profile.

10. An illumination assembly comprising;
    a reflector cup comprising a wall terminating at an inner smooth reflective surface, said inner smooth reflective surface surrounding an interior cavity within said reflector cup;
    a light source located within said interior cavity of said reflector cup;
    a plurality of discrete protrusions extending from said inner smooth reflective surface into said interior cavity;
    wherein, said plurality of discrete protrusions are spaced from one another such that a portion of said smooth reflective surface completely surrounds each of said plurality of discrete protrusions;
    a clear encapsulant at least partially filling said interior cavity of said reflector cup; and
    a lens mounted over said reflector cup and said light source, said encapsulant at least partially filling a void under said lens.

11. The illumination assembly of claim 10, wherein said plurality of discrete protrusions is arranged as a spatially uniform array.

12. The illumination assembly of claim 10, wherein said plurality of discrete protrusions has an irregular spatial arrangement.

13. The illumination assembly of claim 10, further comprising a housing around said reflector cup and said light source.

14. The illumination assembly of claim 10, further comprising a plurality of electrically conductive leads.

15. The illumination assembly of claim 10, said light source comprising at least one light emitting diode die.

16. The illumination assembly of claim 10, said light source comprising a plurality of light emitting diode dice.

17. The illumination assembly of claim 10 and further wherein said plurality of discrete protrusions comprises a plurality of domes.

18. The illumination assembly of claim 17 and further wherein each of said plurality of domes comprises an arcuate profile.

* * * * *